United States Patent
Kim et al.

(10) Patent No.: US 8,230,157 B2
(45) Date of Patent: Jul. 24, 2012

(54) MEMORY DEVICE AND METHOD OF MULTI-BIT PROGRAMMING

(75) Inventors: Jaehong Kim, Seoul (KR); Kyoung Lae Cho, Yongin-si (KR); Jun Jin Kong, Yongin-si (KR); Heeseok Eun, Gyeonggi-do (KR); Seung-Hwan Song, Incheon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 936 days.

(21) Appl. No.: 12/155,647

(22) Filed: Jun. 6, 2008

(65) Prior Publication Data

US 2009/0182934 A1    Jul. 16, 2009

(30) Foreign Application Priority Data

Jan. 14, 2008   (KR) .................. 10-2008-0004147

(51) Int. Cl.
*G06F 12/00* (2006.01)
*G06F 13/00* (2006.01)
*G06F 13/28* (2006.01)
*G06F 11/00* (2006.01)
*G06F 11/10* (2006.01)
*H03M 13/00* (2006.01)
*G11C 29/00* (2006.01)

(52) U.S. Cl. ............... 711/103; 711/162; 711/E12.008; 714/6.24; 714/758; 714/763; 714/768

(58) Field of Classification Search ............ 711/103, 711/162, E12.008; 714/6.24, 758, 763, 768
See application file for complete search history.

(56) References Cited

U.S. PATENT DOCUMENTS

| | | | |
|---|---|---|---|
| 5,404,485 A * | 4/1995 | Ban | 711/202 |
| 5,969,997 A * | 10/1999 | Clinton et al. | 365/189.02 |
| 6,646,928 B2 | 11/2003 | Bondurant | |
| 6,678,811 B2 | 1/2004 | Rentschler et al. | |
| 6,937,537 B2 | 8/2005 | Pfeiffer et al. | |
| 2005/0213393 A1* | 9/2005 | Lasser | 365/185.33 |
| 2006/0101193 A1* | 5/2006 | Murin | 711/103 |
| 2007/0089034 A1* | 4/2007 | Litsyn et al. | 714/763 |

FOREIGN PATENT DOCUMENTS

| KR | 1019990036633 | 5/1999 |
|---|---|---|
| KR | 1019990036982 | 5/1999 |
| KR | 1020040015589 | 2/2004 |

* cited by examiner

*Primary Examiner* — Michael Alsip
(74) *Attorney, Agent, or Firm* — Harness, Dickey & Pierce, P.L.C.

(57) ABSTRACT

Memory devices and multi-bit programming methods are provided. A memory device may include a plurality of memory units; a data separator that separates data into a plurality of groups; a selector that rotates each of the plurality of groups and transmits each of the groups to at least one of the plurality of memory units. The plurality of memory units may include page buffers that may program the transmitted group in a plurality of multi-bit cell arrays using a different order of a page programming operation. Through this, evenly reliable data pages may be generated.

12 Claims, 6 Drawing Sheets

MEMORY DEVICE AND METHOD OF MULTI-BIT PROGRAMMING

PRIORITY STATEMENT

This application claims priority under 35 U.S.C. §119 to Korean Patent Application No. 10-2008-0004147, filed on Jan. 14, 2008, in the Korean Intellectual Property Office (KIPO), the entire contents of which are incorporated herein by reference.

BACKGROUND

1. Field

Example embodiments relate to apparatuses and/or methods that may program data in memory cells of memory devices. Also, example embodiments relate to multi-bit programming apparatuses and/or methods that may program data in multi-level cells (MLCs) or multi-bit cells (MBCs) of MLC memory devices.

2. Description of Related Art

A single-level cell (SLC) memory device may store one bit of data in a single memory cell. The SLC memory may be referred to as a single-bit cell (SBC) memory. The SLC memory may store and read data of one bit at a voltage level included in two distributions that may be divided by a threshold voltage level programmed in a memory cell. Due to a fine electrical characteristic difference between SLC memories, the programmed threshold voltage level may have the distribution within a predetermined range. For example, when a voltage level read from the memory cell is greater than 0.5V and less than 1.5V, it may be determined that the data stored in the memory cell has a logic value of "0". When the voltage level read from the memory cell is greater than 2.5V and less than 3.5V, it may be determined that the data stored in the memory cell has a logic value of "1". The data stored in the memory cell may be classified depending on the difference between cell currents and/or cell voltages during the reading operations.

Meanwhile, a multi-level cell (MLC) memory device that can store data of two or more bits in a single memory cell has been proposed in response to a need for higher integration of memory. The MLC memory device may also be referred to as a multi-bit cell (MBC) memory. However, as the number of bits stored in the single memory cell increases, reliability may deteriorate and the read-failure rate may increase. To store 'm' bits in a single memory cell, $2^m$ voltage level distributions may be required. However, since the voltage window for a memory cell may be limited, the difference in threshold voltage between adjacent bits may decrease as 'm' increases, which may cause the read-failure rate to increase. For this reason, it may be difficult to improve storage density using a MLC memory device.

With the current increase in the utilization of the MLC memory device, error correction codes or error control codes (ECC) that can detect an error during data storing and reading operations and correct the detected error is being more widely used.

Disclosed herein are new multi-level (multi-bit) programming apparatuses and methods for reducing the hardware complexity when embodying ECC hardware.

SUMMARY

Example embodiments may provide apparatuses and/or methods that may apply a new multi-level (multi-bit) programming scheme in a multi-level cell (MLC) memory device, thereby reducing an error when using error control codes (ECC) hardware.

Example embodiments may also provide apparatuses and/or methods that may reduce a maximum bit error rate (BER) per page.

Example embodiments may also provide apparatuses and/or methods that may equalize a BER per page with respect to each page.

Example embodiments may also provide apparatuses and/or methods that may adjust the distribution of errors for each page unit to make data have an error rate within the range of the error correcting capability, thereby improving the error correctability of a page.

According to example embodiments, an apparatus may include a memory device. The memory device may include a plurality of memory units, a data separator that separates data into a plurality of groups, and/or a selector that rotates each of the plurality of groups and transmits each of the groups to at least one of the plurality of memory units.

According to at least some example embodiments, the data separator may include a first encoder that performs first ECC encoding for the data to generate a codeword and a codeword separator that separates the codeword into the plurality of groups.

According to at least some example embodiments, the selector may be a demultiplexer controlled by an identification number assigned to each of the memory units.

According to example embodiments, each of the memory units may include one or more multi-bit cell arrays and one or more page buffers that store data programmed in the multi-bit cell array. In at least some example embodiments, each of the page buffers may program the transmitted group in each of the multi-bit cell arrays using a different order of a page programming operation.

According to at least some example embodiments, the order of the page programming operation may be associated with a number of threshold voltage states that are formed in the multi-bit cell arrays.

According to at least some example embodiments, each of the page buffers may determine the order of the page programming operation, which may be based on a bit error rate of a data page stored in each of the multi-bit cell arrays.

According to at least some example embodiments, each of the memory units may include at least a first multi-bit cell array and a second multi-bit cell array. Each of the memory units may further include a first page buffer that stores first data to be stored in the first multi-bit cell array, and a second page buffer that stores second data to be stored in the second multi-bit cell array. According to example embodiments, the first page buffer may initially store a first data page of the first data in the first multi-bit cell array and then store a second data page of the first data in the first multi-bit cell array. According to example embodiments, the second page buffer may initially store a second data page of the second data in the second multi-bit cell array and then store a first data page of the second data in the second multi-bit cell array.

According to at least some example embodiments, the storing of the second data page of the first data by the first page buffer may require a longer period of time than a period of time of the storing of the first data page of the first data by the first page buffer. According to example embodiments, the storing of the second data page of the second data by the second data buffer may require a longer period of time than a period of time of the storing of the first data page of the second data by the second page buffer.

Example embodiments may also provide a multi-bit programming method of a memory device having a controller, a plurality of page buffers, and a plurality of multi-bit cell arrays corresponding to the plurality of page buffers. The multi-bit programming method may include a step of separating, by the controller, data into a plurality of groups. The method may further include rotating, by the controller, each of the groups and transmitting each of the groups to each of the page buffers. The method may also include storing, by each of the page buffers, the transmitted group. The method may also include programming, by each of the page buffers, the stored group in each of the multi-bit cell arrays using a different order of a page programming operation.

According to at least some example embodiments, the separating step may include performing, by the controller, first ECC encoding for the data to generate a codeword and separating, by the controller, the codeword into the plurality of groups.

According to example embodiments, the method may further include performing, by the controller, ECC encoding for each of the separated groups. According to at least some example embodiments, the rotating step may rotate each of the ECC encoded groups in an encoding order to transmit to each of the multi-bit cell arrays.

According to at least some example embodiments, the programming may include determining, by each of the page buffers, the order of the page programming operation based on a bit error rate of a data page stored in each of the multi-bit cell arrays; and programming, by each of the page buffers, the stored group in each of the multi-bit cell arrays according to the determined order.

Example embodiments may also provide a computer-readable recording medium storing a program for implementing the method described above.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF EXAMPLE EMBODIMENTS

Figure 1:
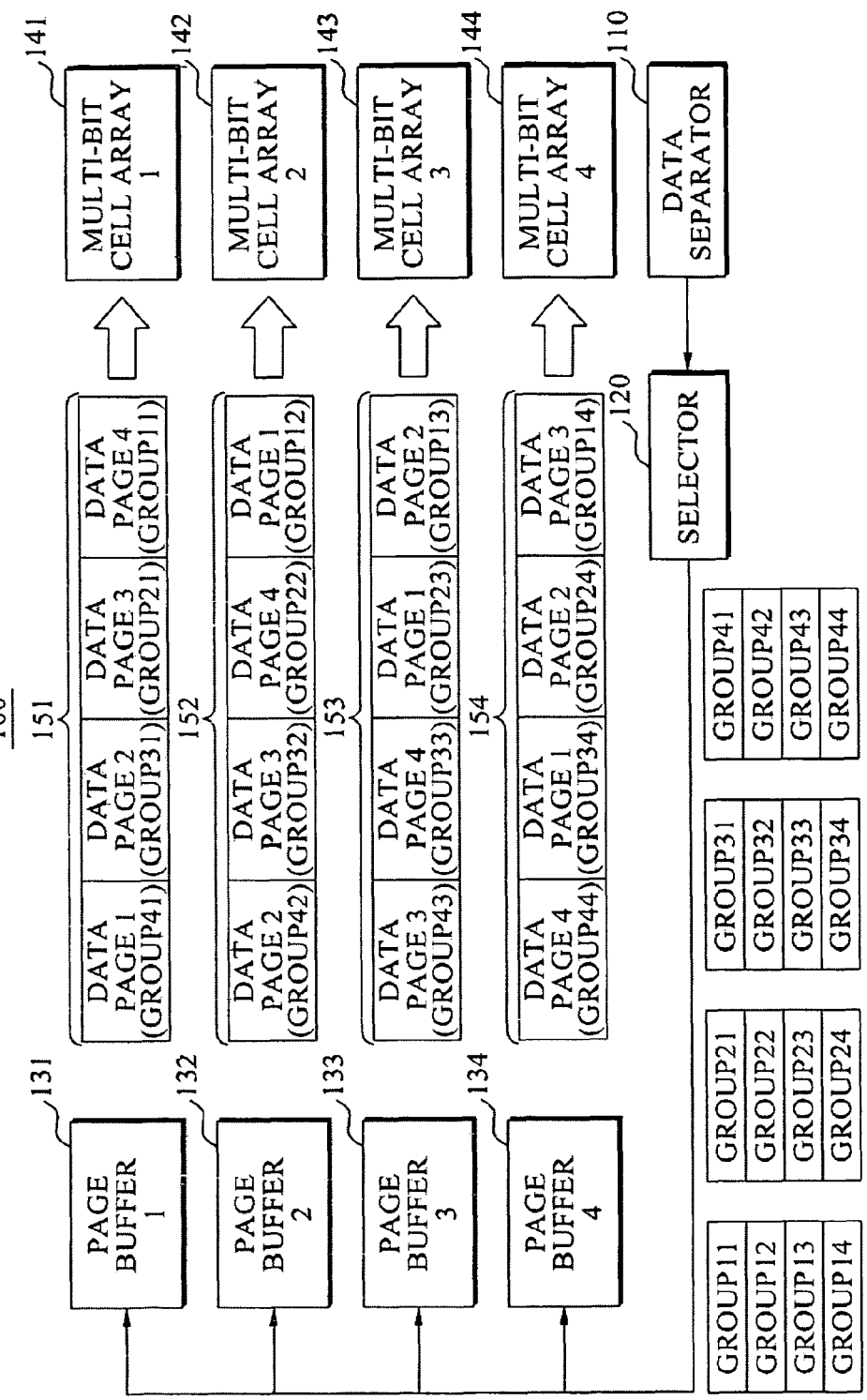
FIG. 1 illustrates an example of a memory device according to example embodiments.

Detailed example embodiments are disclosed herein. However, specific structural and functional details disclosed herein are merely representative for purposes of describing example embodiments. Example embodiments may, however, may be embodied in many alternate forms and should not be construed as being limited to only the embodiments set forth herein.

Accordingly, while example embodiments are capable of various modifications and alternate forms, embodiments thereof are shown by way of example in the drawings and will be described in detail. It should be understood, however, that there is not intent to limit example embodiments to the particular forms disclosed, but to the contrary, example embodiments are to cover all modifications, equivalents, and alternatives falling within the scope of the example embodiments. Like numbers refer to like elements throughout the description of the figures.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

Reference will now be made to example embodiments, which are illustrated in the accompanying drawings, wherein like reference numerals may refer to like components throughout.

Generally, a path for transmitting information may be referred to as a channel. When information is transmitted using wired communication, the channel may be a transmission line transmitting the information, and when information is transmitted using a wireless communication, the channel may be air passing electromagnetic waves containing the information.

Also, a process of storing information in a semiconductor memory device and reading the stored information from the semiconductor memory device may be the channel. The channel may be a temporal lapse from storing of the information until reading of the information, and may also be a physical path of storing information in the semiconductor memory device and reading the stored information from the semiconductor memory device.

While information is being transmitted via the channel, the information may be corrupted. The corrupted information may include an error and thus research is being actively conducted on apparatuses and methods of detecting the error from the corrupted information and eliminating the detected error to restore initial information.

An ECC encoding process may include assigning error control codes (ECC) to initial information prior to transmitting the information to generate transmission information. An ECC decoding process may include receiving the transmission information and separating the ECC from the received transmission information to restore the initial information.

Depending on channel response, an error rate in the channel may be large. As the error rate increases, hardware complexity for error code encoding and decoding may increase in order to overcome the error and achieve the desired performance.

When the channel is a multi-bit memory device, an error may occur due to the channel response. Accordingly, disclosed herein is a multi-bit programming apparatus and method for improving the error correctability when the channel is the multi-bit memory device.

A memory device according to example embodiments may include a multi-bit cell array and a page buffer.

The multi-bit cell array may include a plurality of multi-bit cells. A single multi-bit cell may store multi-bit data. A process of storing, by the memory device, data in the single multi-bit cell may be referred to as "programming" and be performed based on mechanism such as a Fowler-Nordheim (F-N) tunneling and/or the like.

The programming process may change the threshold voltage of the multi-bit cell. When the single multi-bit cell may store maximum of m bits of data, $2^m$ threshold voltage levels may be formed in the single multi-bit cell.

Since the programming process requires a relatively longer period of time in comparison to a data reading process, the memory device may simultaneously program a plurality of adjacent multi-bit cells, thereby reducing a programming time with respect to the whole multi-bit cell array. A set of the simultaneously programmed physical multi-bit cells may be referred to as the "page". A single page may be a set of multi-bit cells connected to a single word line.

When the single multi-bit cell may store m bits of data, the single page that includes p multi-bit cells may store (p×m) bits of data. Each of the multi-bit cells in the page may arrange the m-bit data from a most significant bit (MSB) to a least significant bit (LSB) to store the arranged data.

The memory device may collect the MSB of the p multi-bit cells in the single page and generate a single data page. The data page is a bit stream of p bits. The memory may collect the LSB of the p multi-bit cells in the single page and generate another data page. Accordingly, the memory device may generate m data pages to be stored in the p multi-bit cells of the single page.

In order to store the m data pages in the single page, the memory device may require m page programming operations. During each page programming operation, the memory device may store a single data page in a single page.

The page buffer may be a memory that stores m data pages. Since the page buffer needs to store data while the page programming operation is being performed, the page buffer may not be a non-volatile memory. Generally, the page buffer may consist of a static random access memory (RAM) or a memory similar thereto, and may store (p×m) bits of data.

The page buffer may perform the page programming operations in an order from upper bits (MSBs) to lower bits (LSBs). A first page programming operation may form two threshold voltage states. An m-th page programming operation may form $2^m$ threshold voltage states. As the interval between the threshold voltage states decreases, the probability of mis-reading data may increase. Accordingly, the m-th page corresponding to the LSB may include a relatively large number of errors in comparison to pages corresponding to the upper bits (MSBs).

A memory device, according to example embodiments, may separate a data bit stream that is recognized as the single data page by a controller of the memory device, an external host, or a computing system, and assign the separated data bit stream to a plurality of page buffers. Each of the page buffers containing the separated data bit stream may store data according to a different page programming operation. The memory device may generate the single data page by combining the stored data through an inverse process of the separating, and transmit the generated data page to the controller or the external host.

The data bit stream that is recognized as the single data page by the controller or the host may be separated into a plurality of groups and each of the separated groups may be physically stored by separate page programming operations. Accordingly, it is possible to distribute the error occurrence probability equally.

For example, the data page may be separated into a first group, a second group, a third group, and a fourth group. The first group may be stored by a first page programming operation, the second group may be stored by a second page programming operation, the third group may be stored by a third page programming operation, and the fourth group may be stored by a fourth page programming operation. The third group and the fourth group of the data page may include many errors, whereas the probability that the first group and the second group of the data page may include errors is relatively low. Accordingly, the data page may have equalized error occurrence probability.

The memory device according to example embodiments may equalize the error occurrence probability of data pages, thereby generating evenly reliable data pages.

FIG. 1 illustrates a memory device 100 according to example embodiments.

Referring to FIG. 1, the memory device 100 includes four page buffers, four multi-bit cell arrays, a data separator 110, and a selector 120. The four page buffers include a page buffer (1) 131, a page buffer (2) 132, a page buffer (3) 133, and a page buffer (4) 134. The four multi-bit cell arrays include a multi-bit cell array (1) 141, a multi-bit cell array (2) 142, a multi-bit cell array (3) 143, and a multi-bit cell array (4) 144, respectively.

The page buffer (1) 131 may store data pages to be programmed in the multi-bit cell array (1) 141. The page buffer (2) 132 may store data pages to be programmed in the multi-bit cell array (2) 142. The page buffer (3) 133 may store data pages to be programmed in the multi-bit cell array (3) 143. The page buffer (4) 134 may store data pages to be programmed in the multi-bit cell array (4) 144.

The data separator 110 may separate data into a plurality of groups.

In FIG. 1, the data separator 110 separates the data into four groups. For example, the data separator 110 may separate first data into four groups to generate a group 11, a group 12, a group 13, and a group 14. The data separator 110 may separate second data into four groups to generate a group 21, a group 22, a group 23, and a group 24. The data separator 110 may separate third data into four groups to generate a group 31, a group 32, a group 33, and a group 34. The data separator may separate fourth data into four groups to generate a group 41, a group 42, a group 43, and a group 44.

The selector 120 may rotate each group to transmit to each of the page buffers (1, 2, 3, 4) 131, 132, 133, and 134. The selector 120 may transmit the group 11 to the page buffer (1) 131, transmit the group 12 to the page buffer (2) 132, transmit the group 13 to the page buffer (3) 133, and transmit the group 14 to the page buffer (4) 134.

Similarly, the selector 120 may rotate and transmit each group generated from the first data, the second data, the third data, and the fourth data to each of the page buffers (1, 2, 3, 4) 131, 132, 133, and 134.

According to the above-described scheme, the groups 11, 21, 31, and 41 may be transmitted to the page buffer (1) 131. The groups 12, 22, 32, and 42 may be transmitted to the page buffer (2) 132. The groups 13, 23, 33, and 43 may be transmitted to the page buffer (3) 133. The groups 14, 24, 34, and 44 may be transmitted to the page buffer (4) 134.

The page buffer (1) 131 may store the transmitted data and program data 151 in the multi-bit cell array (1) 141 in a storing order. The data 151 may consist of four data pages.

The page buffer (2) 132 may store the transmitted data and program data 152 in the multi-bit cell array (2) 142 in the storing order. The data 152 may consist of four data pages.

The page buffer (3) 133 may store the transmitted data and program data 153 in the multi-bit cell array (3) 143 in the storing order. The data 153 may consist of four data pages.

The page buffer (4) 134 may store the transmitted data and program data 154 in the multi-bit cell array (4) 144 in the storing order. The data 153 may consist of four data pages.

The page buffer (1) 131 may program the group 11 in the multi-bit cell array (1) 141 by a fourth page programming operation, may program the group 21 in the multi-bit cell array (1) 141 by a third page programming operation, may program the group 31 in the multi-bit cell array (1) 141 by a second page programming operation, and may program the group 41 in the multi-bit cell array (1) 141 by a first page programming operation.

The page buffer (2) 132 may program the group 12 in the multi-bit cell array (2) 142 by the first page programming operation, may program the group 22 in the multi-bit cell array (2) 142 by the fourth page programming operation, may program the group 32 in the multi-bit cell array (2) 142 by the third page programming operation, and may program the group 42 in the multi-bit cell array (2) 142 by the second page programming operation.

The page buffer (3) 133 may program the group 13 in the multi-bit cell array (3) 143 by the second page programming operation. The page buffer (4) 134 may program the group 14 in the multi-bit cell array (4) 144 by the third page programming operation.

Each of the page buffer (1) 131 and the page buffer (2) 132 may program data in a different order of the page programming operation.

When the data is programmed according to the above-described scheme, the first data may include the group 11 programmed by the fourth page programming operation, the group 12 programmed by the first page programming operation, the group 13 programmed by the second page programming operation, and the group 14 programmed by the third page programming operation. When the controller or the host reads the stored first data, the memory device 100 may read the groups 11, 12, 13, and 14 from the four multi-bit cell arrays (1, 2, 3, 4) 141, 142, 143, and 144 and output the read groups 11, 12, 13, and 14.

Although the first data partially includes groups with a relatively great error rate, for example, the groups 11 and 14 in example embodiments, the first data may have an overall equalized error rate.

The second data may include the group 21 programmed by the third page programming operation, the group 22 programmed by the fourth page programming operation, the group 23 programmed by the first page programming operation, and the group 24 programmed by the second page programming operation. Although the second data also partially includes groups with a relatively great error rate, for example, the groups 21 and 22, the second data may have an overall equalized error rate.

The memory device 100 may shuffle the first data, the second data, the third data, and the fourth data to program in four multi-bit cell arrays (1, 2, 3, 4) 141, 142, 143, and 144. The order of the page programming operation to be performed by each of four page buffers (1, 2, 3, 4) 131, 132, 133, and 134 may be associated with the number of threshold voltage states formed in the multi-bit cell arrays (1, 2, 3, 4) 141, 142, 143, and 144.

Generally, the first page programming operation may form two threshold voltage states and the kth page programming operation may form 2k threshold voltage states. Here, $1 \leq k \leq m$.

Since the first page programming operation may form a smaller number of threshold voltage states than the mth page programming operation, data programmed by the first page programming operation may have a lower error rate than data programmed by the mth page programming operation.

The order of the page programming operation to be performed by each of the page buffers (1, 2, 3, 4) 131, 132, 133, and 134 may be determined based on a bit error rate (BER) of the data page programmed in each of the multi-bit cell arrays (1, 2, 3, 4) 141, 142, 143, and 144.

The memory device 100 may shuffle the first data, the second data, the third data, and the fourth data for programming, and adjust the BER of each data to be at the same level. For example, it is assumed that the BER of data programmed by the first page programming operation is $10^{-8}$, the BER of data programmed by the second page programming operation is $10^{-6}$, the BER of data programmed by the third page programming operation is $10^{-4}$, and the BER of data programmed by the fourth page programming operation is $10^{-1}$. According to the conventional art, since the BER of data programmed by the fourth page programming operation is $10^{-1}$, an ECC decoder may be needed to correct all the errors in the data with the BER of $10^{-1}$. However, according to example embodiments, the memory device 100 may shuffle data and store the shuffled data so that each data may have an average BER of about $2.5 \times 10^{-2}$. The memory device 100 may require only an ECC decoder that can correct all the errors in data with the BER of $2.5 \times 10^{-2}$.

As the error correcting capability of the ECC decoder is improved, the hardware complexity of the ECC decoder may increase. The memory device 100 may adjust the error rate of each data to be at the same level and generate evenly reliable data. The memory device 100 may improve the error correctability when using the same ECC decoder and may also reduce the hardware complexity of the ECC decoder.

Examples of probable combinations of the page programming operation to separate and program a single data bit stream may include (1,2,3,4), (1,2,4,3), (1,3,2,4), (1,3,4,2), (1,4,2,3), (1,4,3,2), (2,1,3,4), (2,1,4,3), (2,3,1,4), (2,3,4,1), (2,4,1,3), (2,4,3,1), (3,1,2,4), (3,1,4,2), (3,2,1,4), (3,2,4,1), (3,4,1,2), (3,4,2,1), (4,1,2,3), (4,1,3,2), (4,2,1,3), (4,2,3,1), (4,3,1,2), (4,3,2,1), and the like. (1,2,3,4) may represent (first page programming operation, second page programming operation, third page programming operation, fourth page programming operation).

The memory device 100 may be a 1 channel 4 way solid state disk (SSD). A single page buffer and a single multi-bit cell array may construct a single way. A single channel may be a common input/output bus for sharing data.

Figure 5:
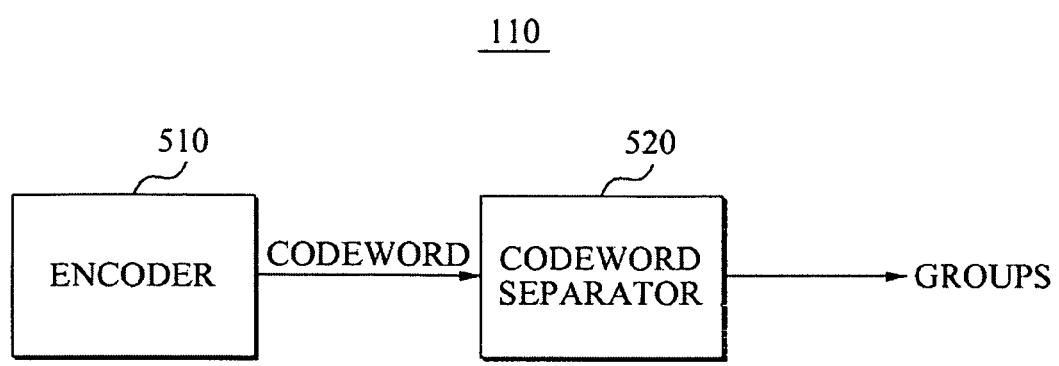
FIG. 5 is a block diagram illustrating an example of a data separator of FIG. 1.

FIG. 5 is a block diagram illustrating another example of the data separator 110 of FIG. 1.

Referring to FIG. 5, the data separator 110 may include an encoder 510 and a codeword separator 520. The encoder 510 may perform ECC encoding for data to generate a codeword. The encoder 510 may assign r bits of redundant bits to a data bit stream of n bits to generate the codeword of (n+r) bits. The encoder 510 may perform ECC encoding for the data based on the n-bit unit.

The codeword separator 520 may separate the codeword into a plurality of groups. The codeword separator 520 may separate each codeword generated by the encoder 510.

Figure 2:
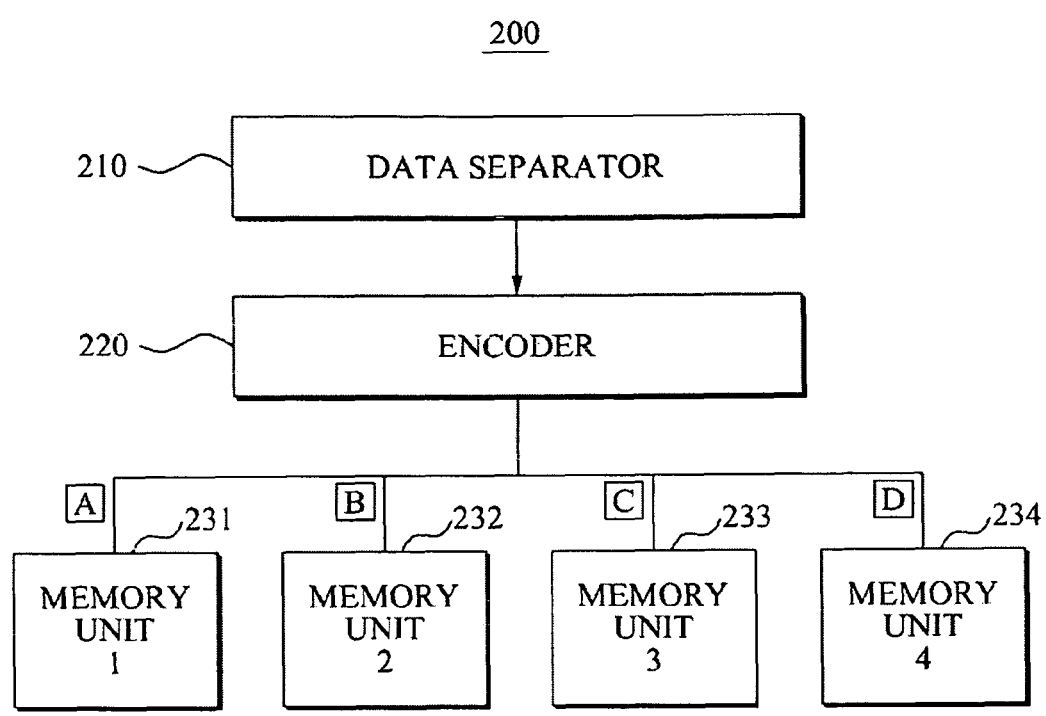
FIG. 2 illustrates an example of another memory device according to example embodiments.

FIG. 2 illustrates a memory device 200 according to example embodiments.

Referring to FIG. 2, the memory device 200 includes a data separator 210, an encoder 220, a memory unit (1) 231, a memory unit (2) 232, a memory unit (3) 233, and a memory unit (4) 234.

The data separator 210 may separate data into a plurality of groups. The encoder 220 may perform ECC encoding for each of the separated groups.

The memory device 200 may rotate each of the ECC encoded groups in an encoding order to transmit to each of the memory units (1, 2, 3, 4) 231, 232, 233, and 234. The memory device 200 may further include a demultiplexer (not shown). The demultiplexer may be controlled by an identification (ID) number assigned to each of the memory units (1, 2, 3, 4) 231, 232, 233, and 234 and rotate each of the ECC encoded groups in the encoding order to transmit to each of the memory units (1, 2, 3, 4) 231, 232, 233, and 234.

The data separator 210 may separate data into four groups. For example, the data separator 210 may separate the data into a group A, a group B, a group C, and a group D.

The encoder 220 may perform ECC encoding for each of the groups A, B, C, and D. When the group A is encoded, the encoder 220 may transmit the group A to the memory unit (1) 231 using the demultiplexer. When the group B is encoded, the encoder 220 may transmit the group B to the memory unit (2) 232 using the demultiplexer. When the group C is encoded, the encoder 220 may transmit the group C to the memory unit (3) 233 using the demultiplexer. When the group D is encoded, the encoder may transmit the group D to the memory unit (4) 234 using the demultiplexer.

The memory device 200 may reduce the ECC encoding time of data and a time that is spent to transmit the data from the controller or the host to each of the memory units (1, 2, 3, 4) 231, 232, 233, and 234. The shuffling configuration of the data at a controller level may generate data pages from the shuffled data, store the generated data pages in a controller buffer, and then sequentially transmit the stored data pages to the page buffer. However, according to example embodiments, the memory device 200 may not require a separate controller buffer.

The memory device 200 may reduce the ECC encoding time of the data and the time spent to transmit the data to each of the memory units (1, 2,3, 4) 231, 232, 233, and 234. Through this, it is possible to reduce the data programming time.

Each of the memory units (1, 2, 3, 4) 231, 232, 233, and 234 may include a multi-bit cell array and a page buffer. Each of page buffers may perform the page programming operation in a different order, thereby programming the data in each of the multi-bit cell arrays.

Example embodiments shown in FIG. 5 may be associated with the data separator 110 of FIG. 1 and may also be applicable to the data separator 210 of FIG. 2.

When example embodiments of FIG. 5 may be applicable to the data separator 210, the encoder 510 may perform ECC encoding for data according to a different encoding scheme from the encoding scheme that may be applied to the encoder 220.

Figure 3:
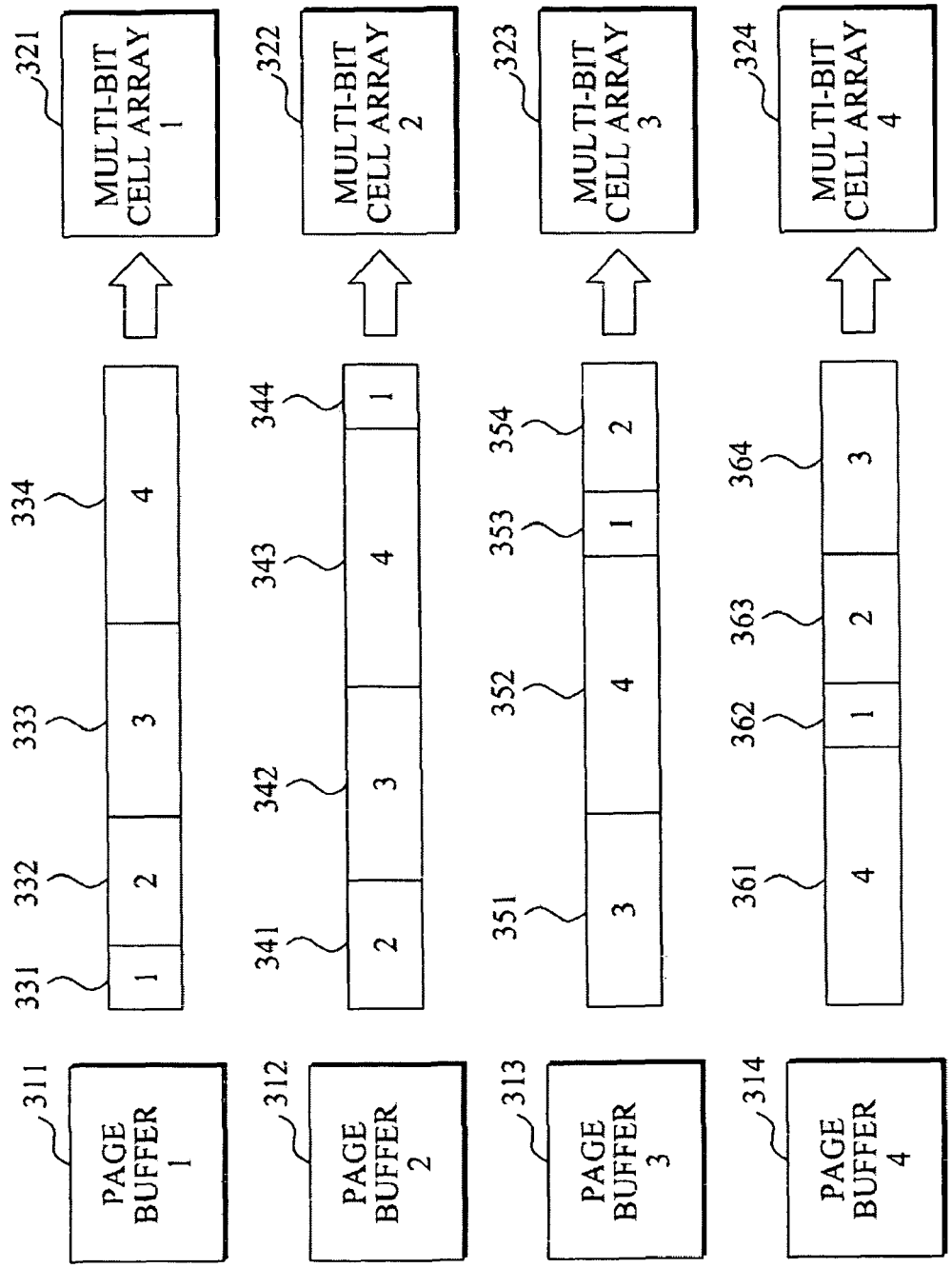
FIG. 3 illustrates still another example of a memory device according to example embodiments.

FIG. 3 illustrates a memory device 300 according to example embodiments.

Referring to FIG. 3, the memory device 300 includes four multi-bit cell arrays and four page buffers. The four multi-bit cell arrays include a multi-bit cell array (1) 321, a multi-bit cell array (2) 322, a multi-bit cell array (3) 323, and a multi-bit cell array (4) 324. The four page buffers include a page buffer (1) 311, a page buffer (2) 312, a page buffer (3) 313, and a page buffer (4) 314.

The page buffer 311 may store data to be programmed in the multi-bit cell array (1) 321. The page buffer (2) 312 may store data to be programmed in the multi-bit cell array (2) 322. The page buffer (3) 313 may store data to be programmed in the multi-bit cell array (3) 323. The page buffer (4) 314 may store data to be programmed in the multi-bit cell array (4) 324.

The page buffer (1) 311 may sequentially program data in the multi-bit cell array (1) 321 in an order of a fourth data page 334, a third data page 333, a second data page 332, and then a first data page 331.

The page buffer (2) 312 may sequentially program data in the multi-bit cell array (2) 322 in an order of a first data page 344, a fourth data page 343, a third data page 342, and then a second data page 341.

The page buffer (3) 313 may sequentially program data in the multi-bit cell array (3) 323 in an order of a second data page 354, a first data page 353, a fourth data page 352, and then a third data page 351.

The page buffer (4) 314 may sequentially program data in the multi-bit cell array (4) 324 in an order of a third data page 364, a second data page 363, a first data page 362, and then a four data page 361.

Generally, the fourth page programming operation may require a relatively longer period of time than the third page programming operation. The first page programming operation may require the shortest period of time.

The page buffer (1) 311 may program the first data page 331 during the shortest period of time, may program the second page 332 during a longer period of time than the programming time of the first data page 331, may program the third data page 333 during a longer period of time than the programming time of the second data page 332, and may program the fourth data page 334 during the longest period of time.

Figure 4:
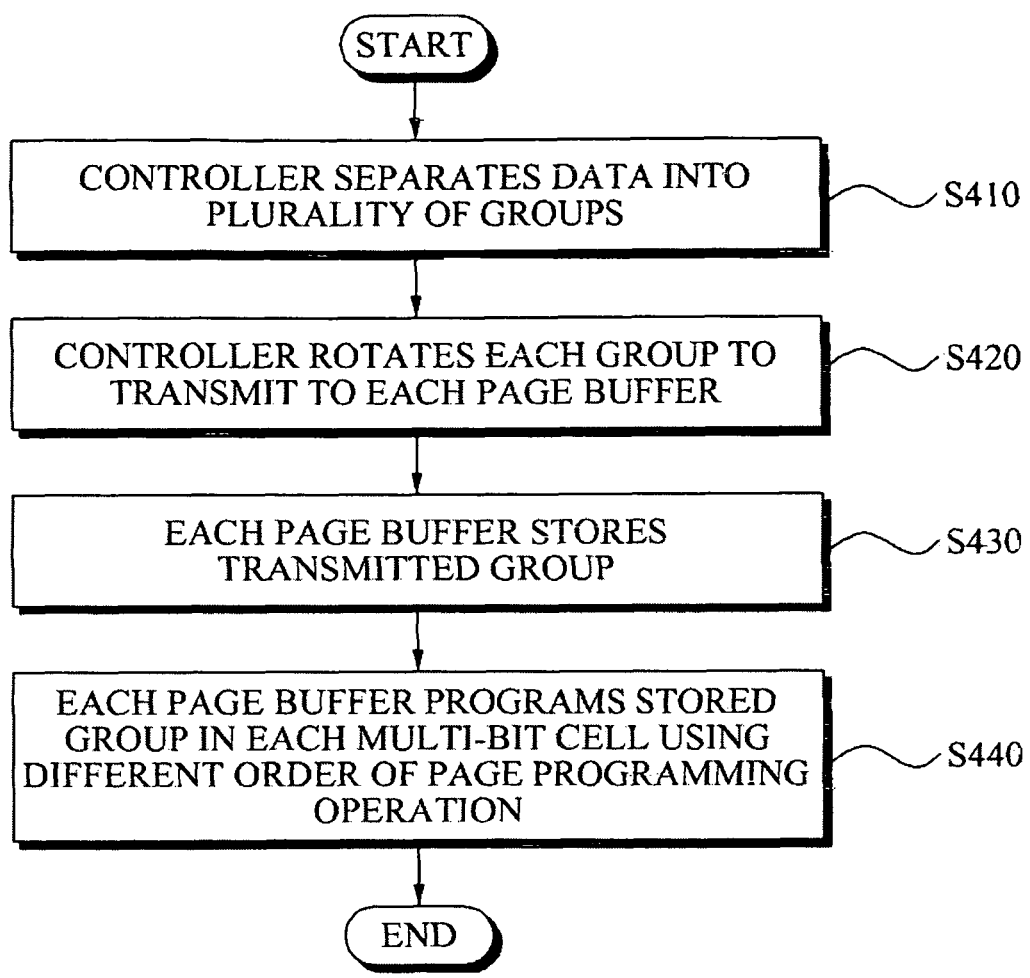
FIG. 4 is a flowchart illustrating a multi-bit programming method according to example embodiments.

FIG. 4 is a flowchart illustrating a multi-bit programming method according to example embodiments.

The multi-bit programming method may be performed in a memory device including a controller, a plurality of page buffers, and a plurality of multi-bit cell arrays corresponding to the plurality of page buffers respectively.

In operation S410, the controller may separate data into a plurality of groups.

In operation S420, the controller may rotate each of the groups to transmit to each of the page buffers.

In operation S430, each of the page buffers may store the transmitted group.

In operation S440, each of the page buffers may program the stored group in each of the multi-bit cell arrays using a different order of a page programming operation.

The controller may perform ECC encoding for each of the separated groups. In operation S420, the controller may transmit each of the ECC encoded groups to each of the multi-bit cell arrays in an encoded order.

According to example embodiments, operation S440 may further include operations as follows:
(1) Each of the page buffers may determine the order of page programming operation based on a BER of a data page stored in each of the multi-bit cell arrays.
(2) Each of the page buffers may program the stored group in each of the multi-bit cell arrays according to the determined order.

Figure 6:
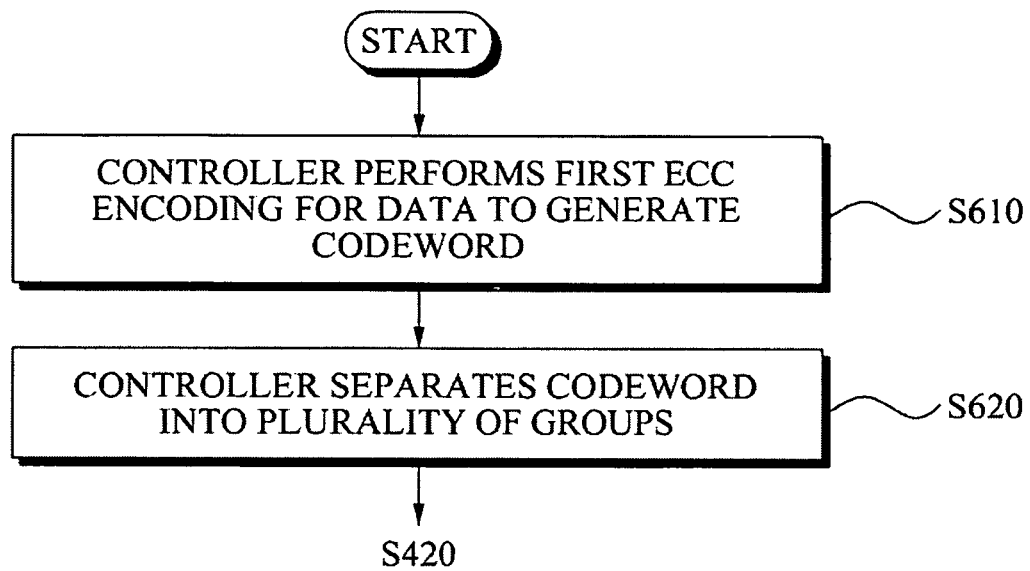
FIG. 6 is a flowchart illustrating a process of separating data according to example embodiments.

FIG. 6 is a flowchart illustrating another example process of operation S410.

In operation S610, the controller may perform first ECC encoding for data to generate a codeword. The first ECC encoding scheme may be different from the encoding scheme that may be performed between operations S410 and S420.

In operation S620, the controller may separate the codeword into a plurality of groups.

The multi-bit programming method according to example embodiments may be recorded in computer-readable media including program instructions to implement various operations embodied by a computer. The media may also include, alone or in combination with the program instructions, data files, data structures, and/or the like. The media and program instructions may be those especially designed and constructed for the purposes of example embodiments, or they may be of the kind well-known and available to those having skill in the computer software arts. Examples of computer-readable media include magnetic media such as hard disks, floppy disks, and magnetic tape; optical media such as CD ROM disks and DVD; magneto-optical media such as optical disks; and hardware devices that are especially configured to store and perform program instructions, such as read-only memory (ROM), random access memory (RAM), flash memory, and the like. Examples of program instructions include both machine code, such as produced by a compiler, and files containing higher level code that may be executed by the computer using an interpreter. The described hardware devices may be configured to act as one or more software modules in order to perform the operations of example embodiments.

Flash memory devices and/or memory controllers according to example embodiments may be embodied using various types of packages. For example, the flash memory devices and/or memory controllers may be embodied using packages such as Package on Packages (PoPs), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Quad Flatpack (QFP), Small Outline Integrated Circuit (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

The flash memory devices and/or the memory controllers may constitute memory cards. In example embodiments, the memory controllers may be constructed to communicate with an external device for example, a host using any one of various types of protocols such as a Universal Serial Bus (USB), a Multi Media Card (MMC), a Peripheral Component Interconnect-Express (PCI-E), Serial Advanced Technology Attachment (SATA), Parallel ATA (PATA), Small Computer System Interface (SCSI), Enhanced Small Device Interface (ESDI), and Integrated Drive Electronics (IDE).

The flash memory devices may be non-volatile memory devices that may maintain stored data even when power is cut off. According to an increase in the use of mobile devices such as a cellular phone, a personal digital assistant (PDA), a digital camera, a portable game console, and an MP3 player, the flash memory devices may be more widely used as data storage and code storage. The flash memory devices may be used in home applications such as a high definition television (HDTV), a digital video disk (DVD), a router, and a Global Positioning System (GPS).

A computing system, according to example embodiments, may include a microprocessor that may be electrically connected with a bus, a user interface, a modem such as a baseband chipset, a memory controller, and a flash memory device. The flash memory device may store N-bit data via the memory controller. The N-bit data may be processed or will be processed by the microprocessor and N may be 1 or an integer greater than 1. When the computing system is a mobile apparatus, a battery may be additionally provided to supply operation voltage to the computing system.

It will be apparent to those of ordinary skill in the art that the computing system according to example embodiments may further include an application chipset, a camera image processor (CIS), a mobile Dynamic Random Access Memory (DRAM), and the like. The memory controller and the flash memory device may constitute a solid state drive/disk (SSD) that uses a non-volatile memory to store data.

While example embodiments have been particularly shown and described, it will be understood by those of ordinary skill in the art that various changes in form and details may be made therein without departing from the spirit and scope of example embodiments as defined by the following claims.

What is claimed is:

1. A memory device comprising:
a plurality of memory units;
a data separator that separates data into a plurality of groups; and
a selector configured to rotate each of the plurality of groups and transmit a plurality of data sets, respectively, to corresponding ones of the plurality of memory units such that each of the plurality of memory units receives a different one of the plurality of data sets, each of the plurality of data sets including at least two of the plurality of groups, wherein each of the plurality of memory units includes one or more multi-bit cell arrays, and
one or more page buffers each corresponding to one of the one or more multi-bit cell arrays, respectively, and configured to receive a data set from among the plurality of data sets transmitted by the selector, and
wherein each of the one or more page buffers is configured to perform a plurality of programming operations, the plurality of programming operations each corresponding to a different number of threshold voltages with respect to the other programming operations from among the plurality of programming operations, and
wherein, for each of the one or more page buffers, the page buffer is configured to program the received data set in the multi-bit cell array corresponding to the page buffer by using a different one of the plurality of page programming operations for each of the at least two groups included in the received data set, the page programming operations used to program the at least two groups included in the received data set being used in a different order with respect to the other page buffers.

2. The memory device of claim 1, wherein the data separator comprises:
a first encoder that performs first ECC encoding for the data to generate a codeword; and
a codeword separator that separates the codeword into the plurality of groups.

3. The memory device of claim 1, wherein the selector is a demultiplexer controlled by an identification number assigned to each of the plurality of memory units.

4. The memory device of claim 1, wherein the order of the page programming operation is associated with a number of threshold voltage states that are formed in the multi-bit cell arrays.

5. The memory device of claim 1, wherein each of the page buffers determines the order of the page programming operation based on a bit error rate of a data page stored in each of the multi-bit cell arrays.

6. The memory device of claim 1, wherein each of the plurality of memory units comprises at least:
a first multi-bit cell array;
a second multi-bit cell array;
a first page buffer that stores first data to be stored in the first multi-bit cell array; and a second page buffer that stores second data to be stored in the second multi-bit cell array,
wherein the first page buffer initially stores a first data page of the first data in the first multi-bit cell array and then stores a second data page of the first data in the first multi-bit cell array, and
the second page buffer initially stores a second data page of the second data in the second multi-bit cell array and then stores a first data page of the second data in the second multi-bit cell array.

7. The memory device of claim 6, wherein the storing of the second data page of the first data by the first page buffer requires a longer period of time than a period of time of the storing of the first data page of the first data by the first page buffer, and the storing of the second data page of the second data by the second data buffer requires a longer period of time than a period of time of the storing of the first data page of the second data by the second page buffer.

8. A multi-bit programming method of a memory device having a controller, a plurality of page buffers, and a plurality of multi-bit cell arrays corresponding to the plurality of page buffers, the method comprising:
separating, by the controller, data into a plurality of groups;
rotating, by the controller, each of the plurality of groups and transmitting a plurality of data sets, respectively, to corresponding ones of the plurality of page buffers, each of the plurality of data sets including at least two of the plurality of groups;
storing, by each of the plurality of page buffers, the transmitted data set, the plurality of page buffers each corresponding to one of the plurality of multi-bit cell arrays, respectively, and being configured to receive a data set from among the plurality of data sets from the controller such that each of the plurality of page buffers receives a different one of the plurality of data sets;
performing a plurality of programming operations using each of the one or more page buffers, the plurality of programming operations each corresponding to a different number of threshold voltages with respect to the other programming operations from among the plurality of programming operations; and
for each of the one or more page buffers, programming the received data set in the multi-bit cell array corresponding to the page buffer by using a different one of the plurality of page programming operations for each of the at least two groups included in the received data set, the page programming operations used to program the at least two groups included in the received data set being used in a different order with respect to the other page buffers.

9. The method of claim 8, wherein the separating comprises:
performing, by the controller, first ECC encoding for the data to generate a codeword; and
separating, by the controller, the codeword into the plurality of groups.

10. The method of claim 8, further comprising:
performing, by the controller, ECC encoding for each of the separated groups,
wherein the rotating rotates each of the ECC encoded groups in an encoding order to transmit to each of the multi-bit cell arrays.

11. The method of claim 8, wherein the programming comprises:
determining, by each of the plurality of page buffers, the order of the page programming operation based on a bit error rate of a data page stored in each of the plurality of multi-bit cell arrays; and
programming, by each of the plurality of page buffers, the stored group in each of the plurality of multi-bit cell arrays according to the determined order.

12. A computer-readable recording medium storing a program for implementing the method of claim 8.

* * * * *